United States Patent
Tanaka et al.

(10) Patent No.: US 6,750,510 B2
(45) Date of Patent: Jun. 15, 2004

(54) CHARGE COUPLED DEVICE AND PRODUCTION THEREOF

(75) Inventors: Hiroshi Tanaka, Mukou (JP); Ken Henmi, Takatsuki (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/354,700

(22) Filed: Jan. 29, 2003

(65) Prior Publication Data

US 2003/0146471 A1 Aug. 7, 2003

(30) Foreign Application Priority Data

Feb. 1, 2002 (JP) .......................................... 2002-025839

(51) Int. Cl.[7] .............................................. H01L 29/76
(52) U.S. Cl. ........................ 257/331; 257/331; 257/330
(58) Field of Search ................................. 257/215, 331, 257/264, 214, 267, 274, 243, 244

(56) References Cited

U.S. PATENT DOCUMENTS 6,515,317 B1 * 2/2003 Bazan et al. ................. 257/215

* cited by examiner

*Primary Examiner*—David Nelms
*Assistant Examiner*—Thinh T Nguyen
(74) *Attorney, Agent, or Firm*—Merchant & Gould P.C.

(57) ABSTRACT

A charge coupled device of the present invention includes a charge transfer region layer and a gate insulation film that are formed in the stated order on a semiconductor substrate, first gate electrodes formed at predetermined spaces on the gate insulation film, and second gate electrodes arranged between the first gate electrodes with at least silicon oxide films being interposed therebetween. Each silicon oxide film has constricted portions where the silicon oxide film is in contact with the gate insulation film, and electric insulation films are formed on the constricted portions so as to form sidewalls. This configuration increases the charge transfer efficiency and increases a dielectric breakdown voltage between gate electrodes. Thus a charge coupled device having high performance and high dielectric strength is provided.

8 Claims, 3 Drawing Sheets

CHARGE COUPLED DEVICE AND PRODUCTION THEREOF

BACKGROUND OF THE INVENTION

1. Field of the Invention

The present invention relates to a charge coupled device suitably employed in a solid-state imaging device for use in, for instance, a digital camera, and to the production thereof.

2. Related Background Art

A charge coupled device (hereinafter referred to as CCD) is a device having a structure in which a multiplicity of metal oxide semiconductor (MOS) structure electrodes are arranged on a surface of a semiconductor, and generally is used as a so-called solid-state imaging device in various types of electronic cameras, facsimiles, etc.

FIG. 2 illustrates a cross-sectional structure of a prior art CCD. A charge transfer region 22 is formed on a P-type silicon substrate 21 in which an impurity is doped, and a gate insulation film 23 is formed on the charge transfer region 22. On the gate insulation film 23, first gate electrodes 24 and second gate electrodes (transfer electrodes) 27 are formed alternately. When a voltage is applied to the gate electrodes, charge stored under each gate electrode is transferred from one electrode to another successively, and the charge is outputted as a voltage at an output section. 28 denotes a potential well.

The following will describe a method for producing the prior art CCD. First, as shown in FIG. 3A, the charge transfer region 22 is formed on the P-type silicon substrate 21, and the gate insulation film 23 is formed on the charge transfer region 22. Subsequently, the first gate electrodes 24 are formed on the gate insulation film 23 by patterning.

Next, as shown in FIG. 3B, the first gate electrodes 24 are oxidized so as to be covered with a silicon oxide film 25. Subsequently, as shown in FIG. 3C, the second electrodes 27 are formed on the gate insulation film 23 so that each is arranged between adjacent first gate electrodes 24. Thus, the first and second gate electrodes 24 and 27 are arranged alternately on the gate insulation film 23, and the silicon oxide film 25 is formed between the gate electrodes, whereby the gate electrodes are insulated electrically from one another by the silicon oxide film 25.

In the case where this method is used, the forming rate of the silicon oxide film 25 decreases with increasing proximity to the gate insulation film 23 since the supply of oxygen decreases. Therefore, as shown in the drawings, on side faces of the first gate electrode 24, the thickness of the silicon oxide film 25 decreases (the silicon oxide film 25 is constricted) with increasing proximity to the gate insulation film 23. The second gate electrode 27 is formed in a state of being in contact with the silicon oxide film 25, and hence, it is formed to have acute-angle edges 32 in its base part on the gate insulation film 23. When a voltage is applied to each gate electrode in the foregoing state, sometimes an electric field is concentrated at the edges 32, thereby causing dielectric breakdown between the first gate electrode 24 and the second gate electrode 27.

To cope with the foregoing problem, conventionally the varying of the conditions for the oxidization of the first gate electrode 24 has been attempted, or alternatively, the increase in the dielectric breakdown voltage between the gate electrodes was attempted by increasing a film thickness t2 (FIG. 3B) of the silicon oxide film 25 on the first gate electrode 24.

However, the foregoing problem has not been solved by any one of the foregoing methods, and particularly the increase in a film thickness t2" (FIG. 3B) of the silicon oxide film 25 necessarily increases a distance g2 (FIG. 3C) between the gate electrodes, thereby impairing the charge transfer efficiency of the CCD. Furthermore, at the same time, a difference t2'-t2" between the film thickness t2' of the silicon oxide film 25 on the side faces of the first gate electrode 24 and the film thickness t2" thereof in contact with the gate insulation film 23 increases, thereby narrowing the angle of the edges 32 on the gate insulation film 23. As a result, the dielectric breakdown tends to occur more easily.

SUMMARY OF THE INVENTION

Therefore, with the foregoing in mind, it is an object of the present invention to provide a charge coupled device that includes a charge transfer region layer and a gate insulation film that are formed in the stated order on a semiconductor substrate, first gate electrodes formed at predetermined spaces on the gate insulation film, and second gate electrodes arranged between the first gate electrodes with at least silicon oxide films being interposed therebetween. In the charge coupled device, each silicon oxide film has constricted portions where the silicon oxide film is in contact with the gate insulation film, and electric insulation films are formed on the constricted portions so as to form sidewalls.

Further, a charge coupled device producing method of the present invention includes (a) forming a gate insulation film on a charge transfer region layer formed on a semiconductor substrate, (b) forming a plurality of first gate electrodes on the gate insulation film so that the first gate electrodes are arranged at predetermined spaces, (c) covering the first gate electrodes with silicon oxide films, (d) forming at least an electric insulation film on the silicon oxide films and the gate insulation film, (e) removing the electric insulation film so that the electric insulation film remains on constricted portions of the silicon oxide films in contact with the gate insulation film, thereby forming sidewalls, and (f) forming second electrodes on the gate insulation film and the electric insulation films.

DETAILED DESCRIPTION OF THE INVENTION

Figure 1A:
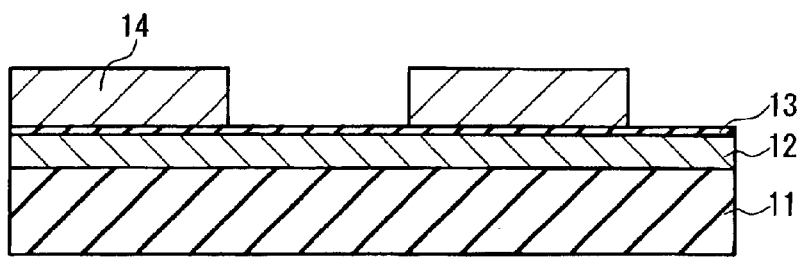
FIGS. 1A to 1E are cross-sectional views illustrating a process for producing a charge coupled device of the present invention.

According to the present invention, the silicon oxide film on the surface of the first gate electrode is constricted where the silicon oxide film is in contact with the gate insulation film, and electric insulation films are formed on the constricted portions, thereby forming sidewalls. This eliminates the "constricted shape" found in the prior art, thereby substantially preventing a decrease in the charge transfer efficiency, and increasing the dielectric breakdown voltage between the gate electrodes. As a result, a charge coupled device having high performance and high dielectric strength can be produced stably and easily.

It is preferable that the sidewalls have a thickness in a range of 10 $\mu$m to 50 $\mu$m, and are substantially uniform.

Here, "substantially uniform" means that the thicknesses fall in a range of an average ±20% of the same, preferably in a range ±10% of the same.

Each sidewall preferably is brought into contact with the gate insulation film at a substantially right angle. Here, the "substantially right angle" indicates that a slight variation of the angle is tolerable, and it signifies an angle in a range of 90°±10°, preferably in a range of 90°±5°.

Furthermore, it is preferable that in the case where the gate insulation film includes a silicon oxide film as its surface layer, the electric insulation film is a silicon nitride film.

Furthermore, it is preferable that in the case where the gate insulation film includes a silicon nitride film as its surface layer, the electric insulation film is any one of a non-doped silicate glass (NSG) film, a tetraethoxysilane (TEOS) film, and a high temperature oxidation silicon oxide (HTO) film. Here, the "high temperature oxidation" means that the oxidation of silicon by heating the same in an oxygen atmosphere at a temperature of not less than 800° C.

The silicon oxide film preferably has a thickness in a range of 10 μm to 50 μm.

Furthermore, each space between the first gate electrodes is in a range of 50 μm and 100 μm.

In the above-described method of the present invention, it is preferable that the removal of the electric insulation film in (e) is performed by anisotropic etching. Furthermore, it is preferable that, in (e), an etching rate with respect to the electric insulation film is set to be higher than an etching rate with respect to the gate insulation film. In other words, the following should be satisfied.

[etching rate for the electric insulation film]>[etching rate for the gate insulation film]

For instance, by increasing an etchant gas and decreasing the flow rate of oxygen ($O_2$), the etching rate of the gate insulation film is decreased.

Furthermore, in (e), an etching rate with respect to the electric insulation film preferably is set to be 1 nm/minute to 10 nm/minute.

According to the present invention, it is possible to provide a charge coupled device having high performance and high dielectric strength stably, by eliminating a decrease in the charge transfer efficiency and increasing the dielectric breakdown voltage between the gate electrodes. More specifically, since a decrease in the charge transfer efficiency due to an increase in the distance between gate electrodes is eliminated and the dielectric breakdown voltage is increased by suppressing the concentration of an electric field at an area between gate electrodes, a charge coupled device of high performance and high dielectric strength can be produced stably and easily. Therefore, a solid-state imaging device obtained employing the foregoing charge coupled device exhibits an excellent resolution.

The following will describe an example of a CCD producing method of the present invention, while referring to the drawings. First of all, as shown in FIG. 1A, an N-type impurity-doped region (charge transfer region) 12 is formed on a P-type silicon substrate 11 by ion injection. Then, a gate insulation film 13 is formed on the charge transfer region 12 so that the gate insulation film 13 has a two-layer structure composed of a silicon oxide film (film thickness: 30 μm) on a lower side and a silicon nitride film (film thickness: 40 μm) on an upper side. Next, first gate electrodes 14 (width: 1 μm, height: 0.25 μm, depth: 1 μm) are formed on the gate insulation film 13 by patterning with use of a polycrystalline polysilicon.

Figure 1B:
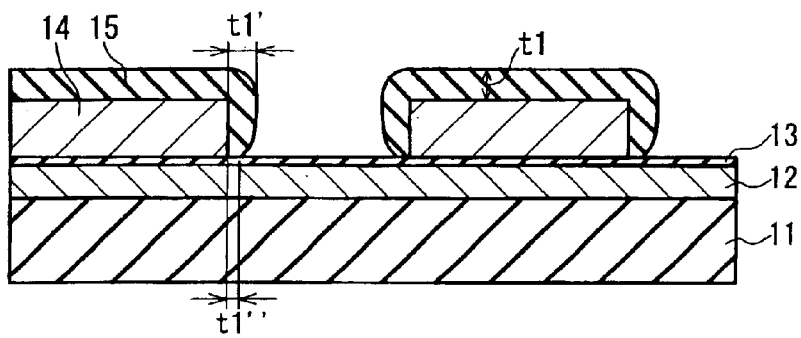

Next, as shown in FIG. 1B, silicon in the first gate electrodes 14 is oxidized so that silicon oxide films grow on surfaces of the electrodes, whereby the first gate electrodes 14 are covered with the silicon oxide films 15 (film thickness: 150 μm). In the case where this method is used, for the reason described above, the silicon oxide film 15 on a side surface of the first gate electrode 14 has a decreased thickness with increasing proximity to the gate insulation film 13, as shown in the drawings. For instance, in the case where the silicon oxide film 15 on the first gate electrode 14 has a film thickness t1 of approximately 150 nm, a film thickness t1' thereof on the side face of the first gate electrode 14 is approximately 110 nm, and a film thickness t1" of a portion thereof in contact with the gate insulation film 13 is approximately 80 nm. Thus, a difference between the two film thicknesses (t1'–t1") is approximately 30 nm.

Figure 1C:
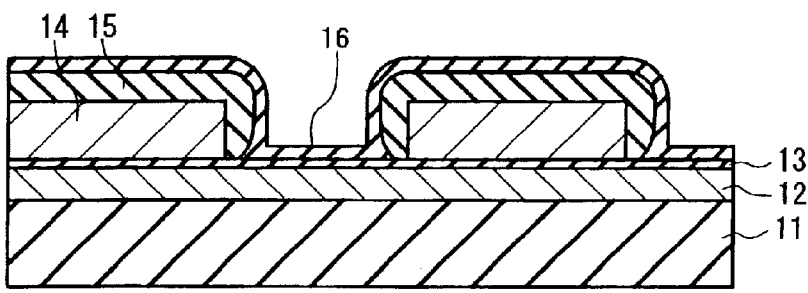
Figure 1D:
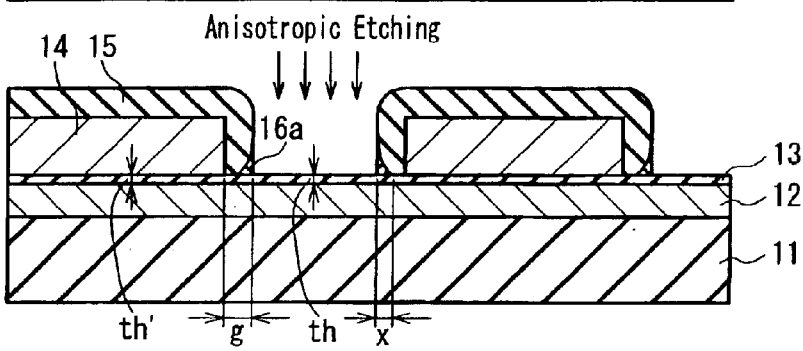

Subsequently, as shown in FIG. 1C, an electric insulation film 16 (film thickness: 30 μm) is formed on the gate insulation film 13 and the silicon oxide film 15 by the chemical vapor deposition (CVD) method with use of silicon oxide. Subsequently, as shown in FIG. 1D, the electric insulation film 16 is subjected to anisotropic etching so that a part of the electric insulation film 16 remains, which forms sidewalls 16a in contact with the gate insulation film 13 on side surfaces of the silicon oxide film 15. Here, for instance, in the case where the difference (t1–t1") between a film thickness t1 of the silicon oxide film 15 on a top face of the first gate electrode 14 and the film thickness t1" (FIG. 1B) of the portion thereof in contact with the gate insulation film 13 is not less than 30 nm, the electric insulation film 16 preferably is formed so as to have a thickness of not less than 30 nm.

Here, at least a surface portion of the gate insulation film 13 and the electric insulation film 16 preferably are made of materials of types that differ from each other in the rate of anisotropic etching. If materials of the same type are used for forming at least the surface portion of the gate insulation film 13 and the electric insulation film 16, it is difficult to cause the etching to stop at a stage in which the electric insulation film 16 is removed on the gate insulation film 13, and sometimes the gate insulation film 13 is eroded due to the etching. After the etching, the gate insulation film 13 remaining between adjacent first gate electrodes 14 (film thickness: th) functions as a gate insulation film for the second gate electrode 17, while the gate insulation film 13 under the first gate electrode 14 (film thickness: th') functions as a gate insulation film for the first gate electrode 14. Therefore, if the gate insulation film 13 is eroded as described above, thereby generating a thickness difference (th'–th) between the respective gate insulation films for the first gate electrode 14 and the second gate electrode 17, a potential difference of charge under the gate electrodes is generated upon the application of a voltage.

By using materials of different types for forming at least the surface portion of the gate insulation film 13 and the electric insulation film 16, the thickness difference that affects the potential difference can be minimized, even in the case where the etching rate is varied for each insulation film so as to increase the selection ratio of the electric insulation film 16 and the gate insulation film 13 by the anisotropic etching. More specifically, in the case where a silicon nitride film is used as a surface portion of the gate insulation film 13, any one of a non-doped silicate glass (NSG) film, a tetraethyl orthosilicate (TEOS) film, and a high temperature oxidation (HTO) film preferably is used as the electric insulation film 16. In the case where a silicon oxide film is used as a surface portion of the gate insulation film 13, a silicon nitride film preferably used as the electric insulation film 16.

It should be noted that in the case where the etching is applied uniformly in the plane of the P-type silicon substrate 11, an increased selection ratio of the insulation films by anisotropic etching causes the gate insulation film 13 to be eroded significantly, thereby sometimes damaging the P-type silicon substrate 11. Therefore, in this case, it is preferable that the etching rate of the electric insulation film 16 is set smaller. More specifically, the power of a lower electrode in the anisotropic etching preferably is set to be in a range of 100 W to 300 W, as compared with 500 W in a normal case, and the etching rate of the electric insulation film 16 preferably is set to be in a range of 1 nm/minute to 10 nm/minute, more preferably less than 1 nm/minute, as compared with the 250 nm/minute order in a normal case.

Figure 1E:
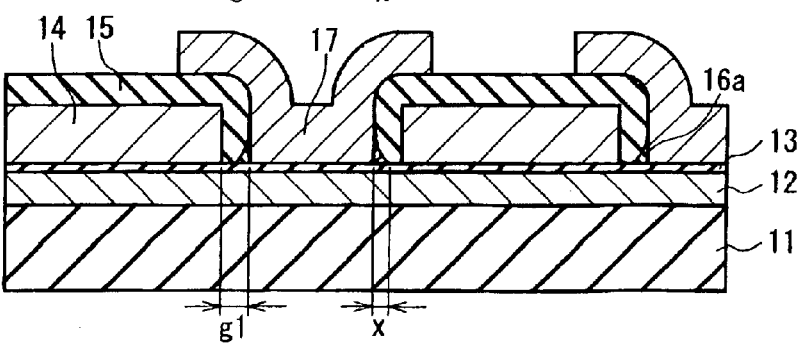
Figure 2:
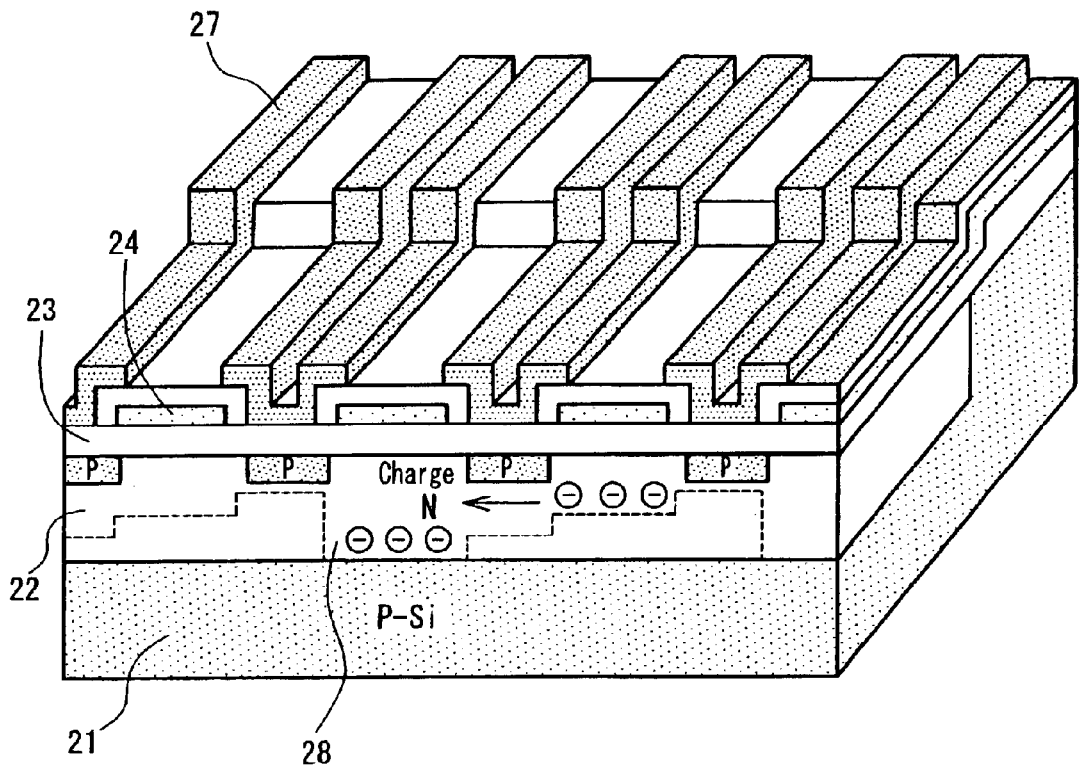
FIG. 2 is a partially cutaway view in perspective of a charge coupled device of the prior art.
Figure 3A:
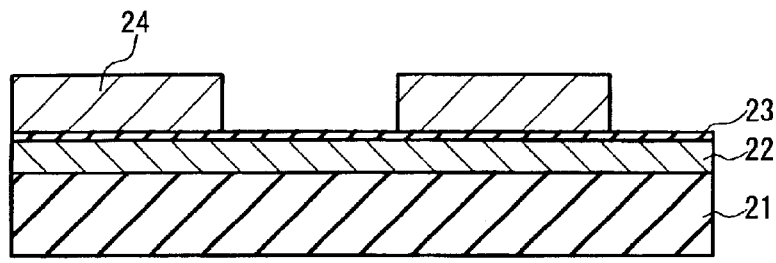
FIGS. 3A to 3C are cross-sectional views illustrating a process for producing a charge coupled device of the prior art.
Figure 3B:
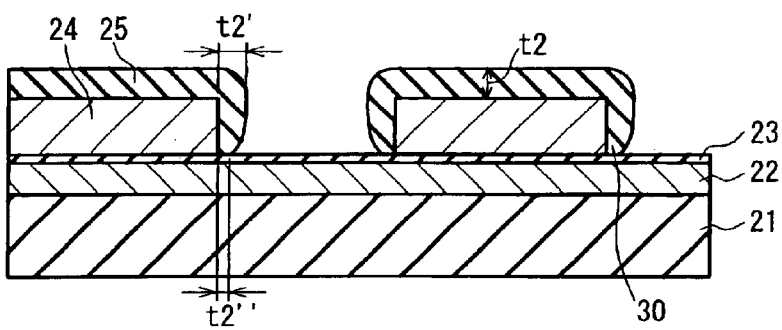
Figure 3C:
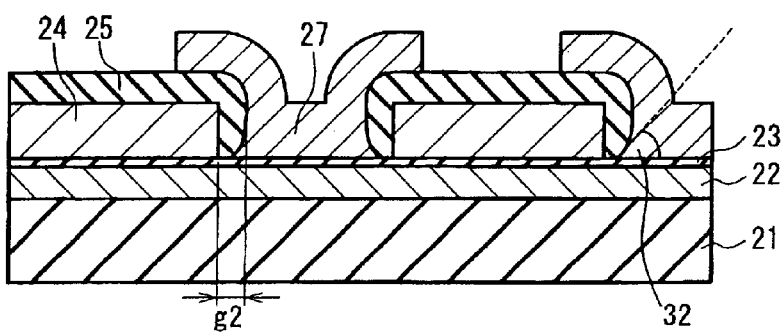

Subsequently, as shown in FIG. 1E, the second gate electrodes 17 are formed with a polycrystalline polysilicon on the gate insulation film 13 so that each second gate electrode 17 falls between adjacent first gate electrodes 14. Thus, the first gate electrodes 14 and the second gate electrodes 17 are arranged alternately on the gate insulation film 13, and the silicon oxide films 15 are formed between the gate electrodes. Thus, a two-phase drive type CCD is provided in which the gate electrodes are insulated electrically from one another by the silicon oxide films 15.

Furthermore, here, remaining in the vicinity of the gate insulation film 13 where the silicon oxide films 15 have a reduced thickness, the sidewalls 16a causes the silicon oxide films 15 on the side faces of the first gate electrodes 14 to have an apparently substantially uniform thickness in a depth direction of the device. Therefore, the concentration of the electric field to an area between the gate electrodes can be suppressed, without increasing the distance g between the gate electrodes as in the prior art. Here, it should be noted that the distance g1 is equal to a sum (t1"+X) based on the film thickness t1" (approximately 80 nm) (FIG. 1B) of the portion of the silicon oxide film 15 in contact with the gate insulation film 13 and a thickness X (approximately 30 nm) of the sidewalls 16a, and hence, it is approximately 110 nm.

It should be noted that the present invention can be applied in the same manner even if the gate insulation film 13 has a structure other than the two-layer structure, for instance, a single-layer structure of the oxide film alone, or even if a CCD obtained has a configuration other than a configuration of the two-phase drive, for instance, a configuration of three-phase drive.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A charge coupled device comprising:
   a charge transfer region layer and a gate insulation film that are formed in the stated order on a semiconductor substrate;
   first gate electrodes formed at predetermined spaces on the gate insulation film; and
   second gate electrodes arranged between the first gate electrodes with at least silicon oxide films being interposed therebetween,
   wherein each silicon oxide film has constricted portions where the silicon oxide film is in contact with the gate insulation film, and electric insulation films are formed on the constricted portions so as to form sidewalls.

2. The charge coupled device according to claim 1, wherein the sidewalls have a substantially uniform thickness.

3. The charge coupled device according to claim 1, wherein each sidewall is brought into contact with the gate insulation film at a substantially right angle.

4. The charge coupled device according to claim 1, wherein the gate insulation film includes a silicon oxide film as its surface layer and the electric insulation film is a silicon nitride film.

5. The charge coupled device according to claim 1, wherein the gate insulation film includes a silicon nitride film as its surface layer and the electric insulation film is any one of a non-doped silicate glass (NSG) film, a tetraethyl orthosilicate (TEOS) film, and a high temperature oxidation (HTO) film.

6. The charge coupled device according to claim 1, wherein each sidewall has a thickness in range of 10 $\mu$m to 50 $\mu$m.

7. The charge coupled device according to claim 1, wherein the silicon oxide film has a thickness in a range of 10 $\mu$m to 50 $\mu$m.

8. The charge coupled device according to claim 1, wherein each space between the first gate electrodes is in a range of 50 $\mu$m and 100 $\mu$m.

* * * * *